United States Patent
Milne et al.

[11] Patent Number: 5,485,599
[45] Date of Patent: Jan. 16, 1996

[54] METHOD AND APPARATUS FOR SIMULATION OF A PHYSICAL PROCESS

[75] Inventors: George J. Milne; William P. Cockshott, both of Glasgow, Scotland

[73] Assignee: The University of Strathclyde, Glasgow, Scotland

[21] Appl. No.: 852,225

[22] PCT Filed: Nov. 27, 1990

[86] PCT No.: PCT/GB90/01841
§ 371 Date: May 28, 1992
§ 102(e) Date: May 28, 1992

[87] PCT Pub. No.: WO91/08560
PCT Pub. Date: Jun. 13, 1991

[30] Foreign Application Priority Data

Dec. 1, 1989 [GB] United Kingdom .................. 8927281

[51] Int. Cl.⁶ ........................ G06F 15/60; G06F 17/00
[52] U.S. Cl. ................... 395/500; 364/DIG. 1; 364/DIG. 2; 364/221; 364/221.2; 364/916; 364/916.3
[58] Field of Search ............... 395/DIG. 1 MS File, 395/DIG. 2 MS File, 500, 800

[56] References Cited

U.S. PATENT DOCUMENTS 3,728,534  4/1973  Bertram et al. .................. 235/184
4,376,538  3/1983  Kennan .......................... 273/275

FOREIGN PATENT DOCUMENTS 0228915  7/1987  European Pat. Off. .
0372833  6/1990  European Pat. Off. .

OTHER PUBLICATIONS

"A Functional Modeling Strategy for Silicon Compilation", by Ken McElvain, pp. 1–6.

*Primary Examiner*—Robert B. Harrell
*Attorney, Agent, or Firm*—Bell, Seltzer, Park & Gibson

[57] ABSTRACT

In the simulation of a spatially-extended physical process the complete spatial extent of which is defined by a multiplicity of parameters, each parameter is represented with a multi-state distinguished sequential digital logic circuit the possible states of which represent the possible states of the pertaining parameter. The interaction of each pair of parameters is represented with an interconnection between the pertaining circuits. Each logic circuit is initially established in a known state and thereafter at least one circuit is pulsed to cause evolution of the circuits through some or all of their possible states. The states of certain circuits are determined intermittently as a measure of the corresponding states of the parameters.

9 Claims, 3 Drawing Sheets

METHOD AND APPARATUS FOR SIMULATION OF A PHYSICAL PROCESS

FIELD OF THE INVENTION

This invention relates to a method and apparatus for simulation of a spatially-extended physical process.

BACKGROUND OF THE INVENTION

Simulation of spatially-extended physical processes is already well known and conventionally is implemented on a digital computer which has the ability of modelling the physical process, the complete spatial extent of which is defined by a multiplicity of parameters, utilising signal input/output devices, a logic unit and a memory unit. The memory unit has a first set of memory cells which contain values for the multiplicity of parameters and a second set of memory cells which store a logic unit instruction program. The logic unit is arranged to fetch first instructions from the second set of memory cells and to implement these first instructions on first selected parameter values retrieved from the first set of memory cells in order to compute new values for these parameters which are then returned to the first selected cells of the first set. This procedure is then repeated through second and subsequent instructions implemented on second and subsequent selected parameter values. Intermittently the logic unit recycles through the first, second and subsequent instructions to update the first, second and subsequent parameter values. The development of the physical process is thus simulated on a cyclic basis with each cycle containing a plurality of sequential steps each operating on a selection of parameter values. Each selection is limited by the number of binary bits of information that can be transmitted simultaneously between the logic unit and the memory unit on the conductors interconnecting these units and as a practical matter these conductors are limited in number being substantially fewer than the number of parameters in the multiplicity defining the physical process. Accordingly, the speed of operation of the known simulation method and apparatus is limited and the multiplicity of parameter values cannot be updated simultaneously.

OBJECT AND SUMMARY OF THE INVENTION

It is an object of the present invention to provide a new and improved method and apparatus for simulating a physical process.

According to the present invention there is provided a method of simulating a spatially-extended physical process the complete spatial extent of which is defined by a multiplicity of parameters, the method comprising representing each parameter with a multi-state distinguished sequential digital logic circuit the possible states of which represent the possible states of the pertaining parameter, representing the interaction of each pair of parameters with an interconnection between the pertaining multi-state distinguished sequential digital logic circuits, initially establishing each logic circuit in a known state, pulsing at least one of the multi-state distinguished sequential digital logic circuits in the array to cause circuits of the array to evolve through at least some of their possible states, and intermittently determining the states of at least some of the circuits of the array as a measure of the corresponding states of the parameters of the physical process.

The pulsing step may be implemented by an external pulse signal applied to all of the circuits of the array or by an internal pulse signal generated by one or more of the circuits of the array and applied to less than all of the circuits of the array.

In another aspect the present invention provides apparatus for simulating a spatially-extended physical process the complete spatial extent of which is defined by a multiplicity of parameters, the apparatus comprising a multiplicity of multi-state sequential digital logic circuits each distinguished to represent a respective one of the multiplicity of parameters of the process so that the possible states of each said circuit represent the possible states of the pertaining parameter, means interconnecting at least those said circuits representing parameters having mutual interaction, means for initially establishing each logic circuit in an known state, means for pulsing at least one of said circuits to cause circuits of the array to evolve through at least some of their possible states, and means for intermittently determining the states of at least some of said circuits to provide a measure of the corresponding states of the parameters of the physical process.

By virtue of the present invention the value of each parameter can be updated simultaneously when the array is pulsed and can be repeatedly updated by applying repeated pulses which only require to be time separated sufficiently to accommodate signal propagation delays in the array. Accordingly, simulation of the development of the spatially-extended physical process is much faster than hitherto arising out of the absence of a memory unit and fetch-and-carry steps associated therewith.

Preferably the apparatus comprises a multiplicity of universal sequential digital logic circuits each associated with means adapted to configure the pertaining circuit distinguished to represent a pertaining parameter as aforesaid. Conveniently the adaption means comprises a fixed logic circuit. Each universal sequential digital logic circuit and associated adaption means may be configured to represent a plurality of distinguished circuits.

Preferably the apparatus comprises a plurality of rectilinear circuit boards each containing a universal sequential digital logic circuit and associated adaption means as aforesaid, each board being interconnected to its neighbours via orthogonally disposed signal conductors emergent from each board edge. The emergent signal conductors may take the form of edge connectors or any other suitable form of connector. Conveniently said signal conductors comprise a first conductor set interconnecting the universal sequential digital logic circuits of adjacent boards, and a second conductor set interconnecting the adaption means (fixed logic circuits) of adjacent boards.

Preferably also, said initially establishing means is formed by said fixed logic circuits, the interconnection thereof with the pertaining universal sequential digital logic circuit, signals conducted by the second conductor set, and synchronisation or reset signals delivered to the fixed logic circuits from a central synchronisation unit.

Preferably also, on each board neighbouring sequential digital logic circuits are interconnected via orthogonally disposed signal pathways forming on-board extensions of said orthogonally disposed signal conductors, said pathways comprising selectively-operable switches the settings of which define the presence or absence of an interconnection between adjacent distinguished sequential digital logic circuits.

BRIEF DESCRIPTION OF THE DRAWINGS

An embodiment of the present invention will now be described by way of example with reference to the accompanying drawings, in which.

DETAILED DESCRIPTION

Figure 1:
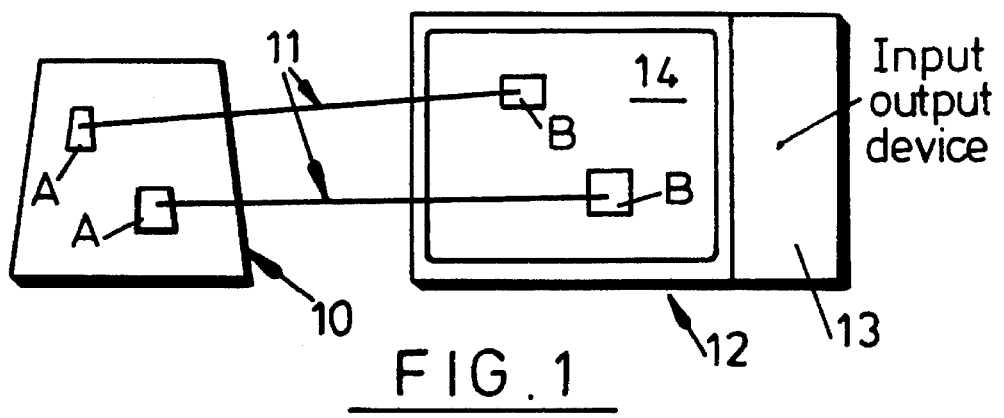
FIG. 1 schematically illustrates apparatus for simulating a spatially-extended physical process.

The embodiment which will now be described is particularly suitable for simulating a two-dimensional spatially extended physical process such as the flow of a thin slice of fluid, or the evolution of a two-dimensional slice of a solid or the behaviour of an electronic circuit chip, but is not limited in application to two-dimensional processes. Such a spatially-extended process is diagrammatically shown by numeral 10 in FIG. 1 and comprises a plurality of areas A of which only two are shown, each area A being defined by parameters of the process 10. FIG. 1 also illustrates apparatus 12 for simulating the process 10 as comprising input/output devices 13 and a simulation surface 14, the latter being formed by sequential logic circuits B which are organised respectively to represent areas A as denoted by lines 11 such that the possible states of a circuit B conceptually represent the states of the parameters of the pertaining area A.

Figure 2:
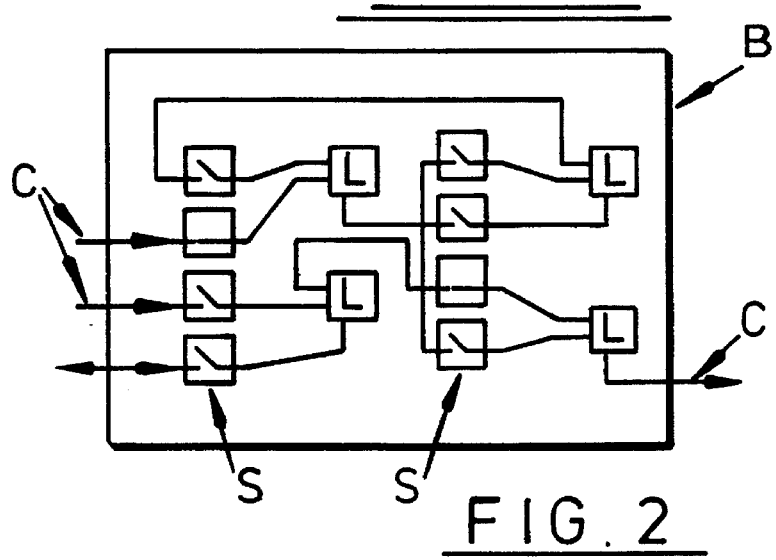
FIG. 2 illustrates one circuit of the FIG. 1 apparatus.
Figure 3:
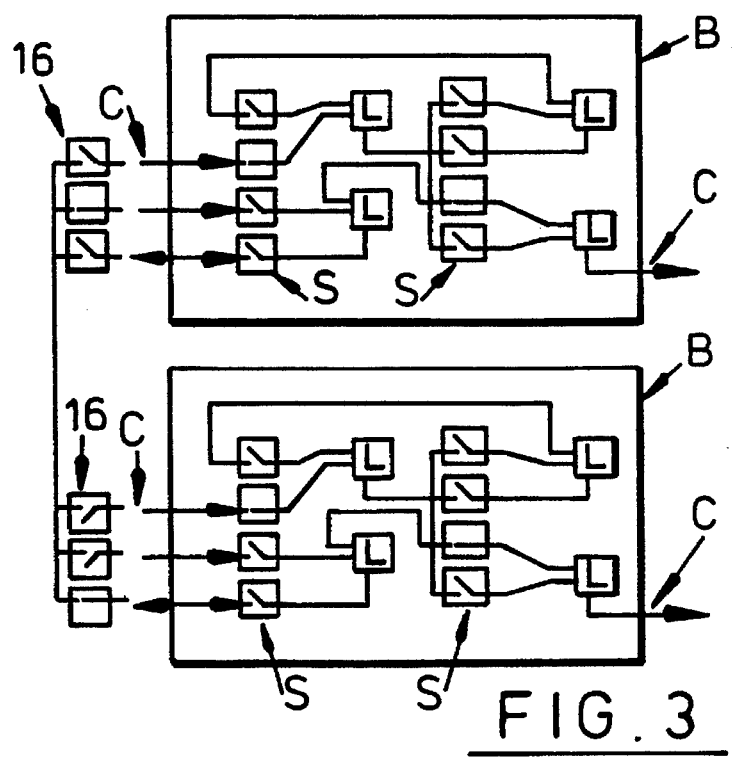
FIG. 3 illustrates interconnection of a pair of FIG. 2 circuits.
Figure 4:
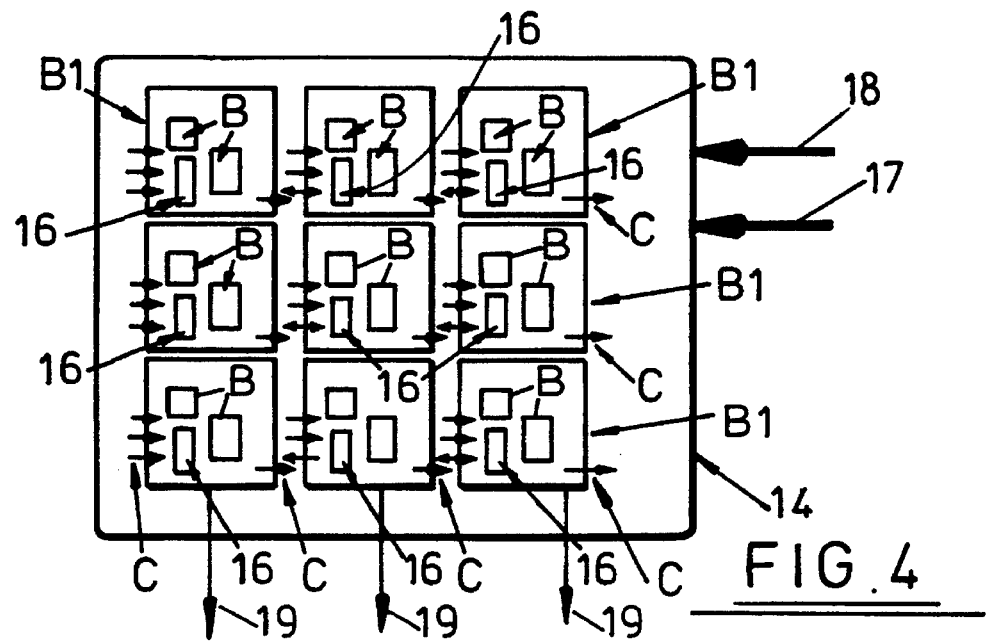
FIG. 4 illustrates an array of interconnected FIG. 2 circuits.

By way of example one circuit B is shown in FIG. 2 as comprising four logic cells L interconnected by signal pathways incorporating eight switches S each capable of being set either in open or closed condition for the purpose of rendering the particular circuit B distinguished so as to represent a particular area A of the process 10. The FIG. 2 circuit B has four conductors C which emerge from circuit B to enable interconnection with one or more adjoining circuits B via selectively-operable switches 16 as schematically illustrated in FIG. 3 for the purpose of representing interaction of the parameters of the corresponding areas A of the process 10. A plurality of the circuits B with interconnecting switches 16 are preferably implemented by a single circuit block B1, described with reference to FIG. 5 and the complete simulation surface 14 is formed of a set of interconnected circuit blocks B1 as shown in FIG. 4 each circuit block B1 having had its circuits B set to a predetermined state by a distinguished set of reset signals 17 from the input/output device 13. Clock pulses 18 externally provided (in this case) to the surface 14 then cause the circuits B to evolve through a series of states corresponding to development of the process 10. The developing values of the parameters of the process 10 are represented by signals appearing on conductors 19 emergent from each circuit block B1 and which form part of input/output device 13.

Figure 5:
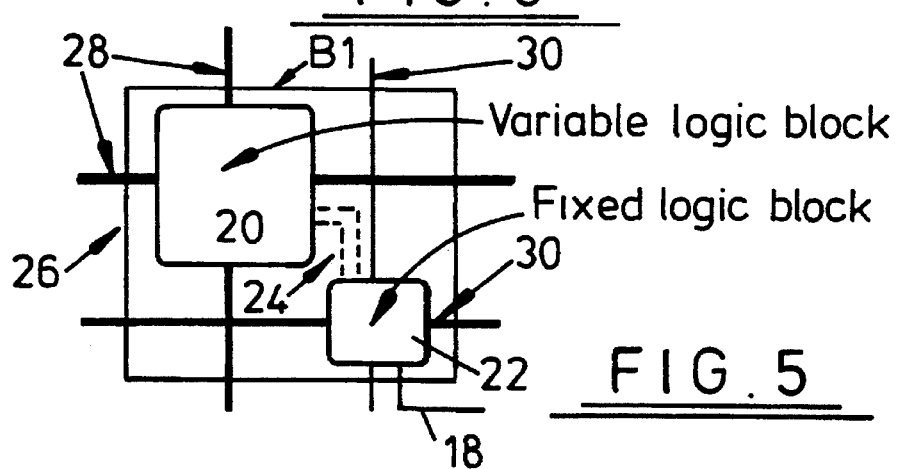
FIG. 5 illustrates one practical implementation of the FIG. 2 circuit.

Each circuit block B1 is preferably implemented, as shown in FIG. 5, by a variable logic block 20 in association with a fixed logic block 22, these blocks 20, 22 being interconnected by a conductor set 24 mounted on a rectangular circuit board 26. Variable logic block 20 is of universal configuration and is configured to the required sequential logic state or states so as to represent one or more circuits B by the fixed logic block 22. Board 26 is interconnected to its neighbours via orthogonally disposed signal conductors comprising a first conductor set 28 connected only to the variable logic block 20 and a second conductor set 30 connected only to the fixed logic block 22. Each set has a north, south, east and west conductor so that the number of such conductors on opposite sides of the board 26 is the same. External synchronisation or clock pulse signals 18, when provided, are delivered to the fixed logic block 22.

Figure 6:
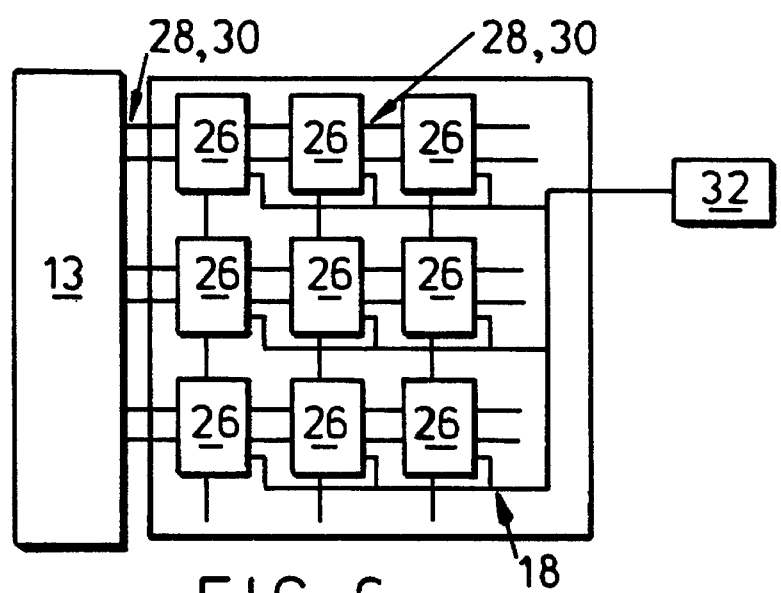
FIG. 6 illustrates an array of interconnected FIG. 5 boards.

The surface 14 is thereafter formed as shown in FIG. 6 by a two-dimensional array of the boards 26 of FIG. 5 with each board 26 connected to its neighbours via conductor sets 28, 30. All boards 26 other than those at the edges of the array have the same connector pattern and some or all edge boards are connected via conductor sets 28, 30 to the input/output device 13 (of FIG. 1). Each board 26 has a sync signal supplied to it from a central synchronization unit 32.

Figure 7:
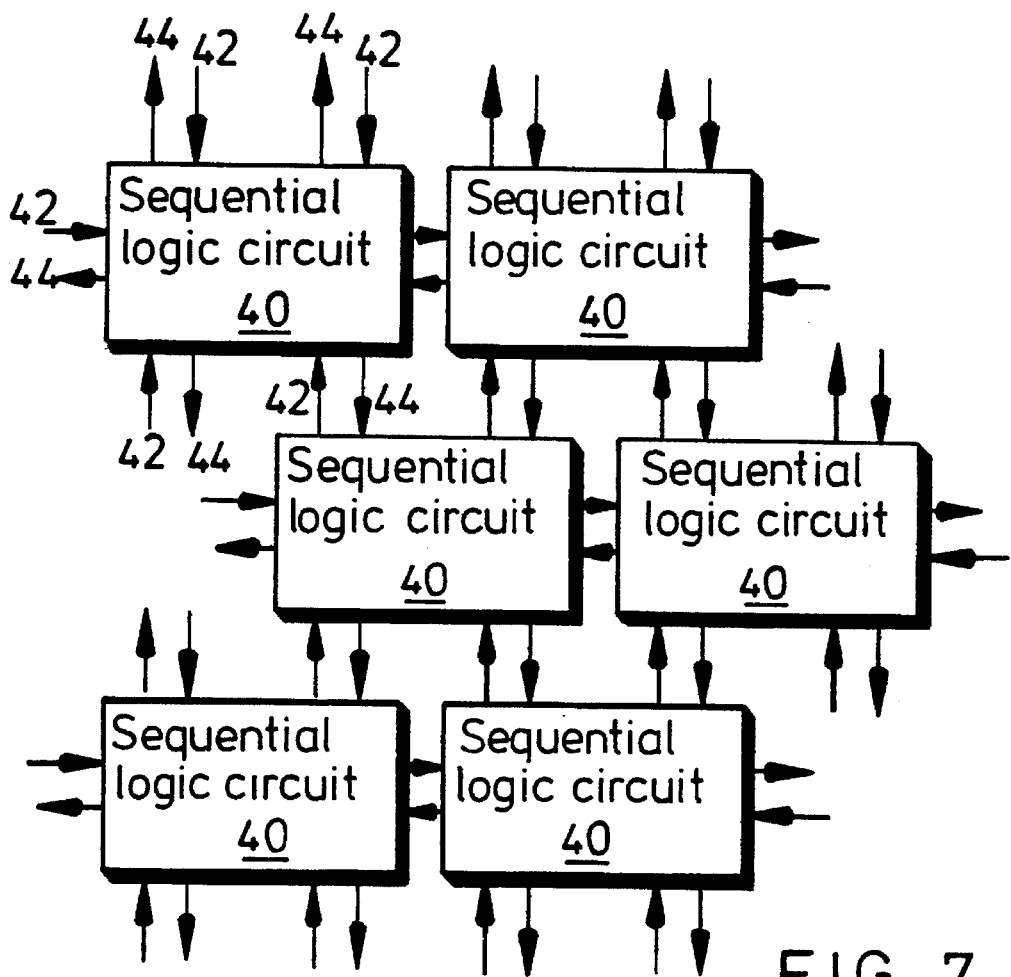
FIG. 7 illustrates a specific form of sequential circuits adapted to model a specific process.
Figure 8:
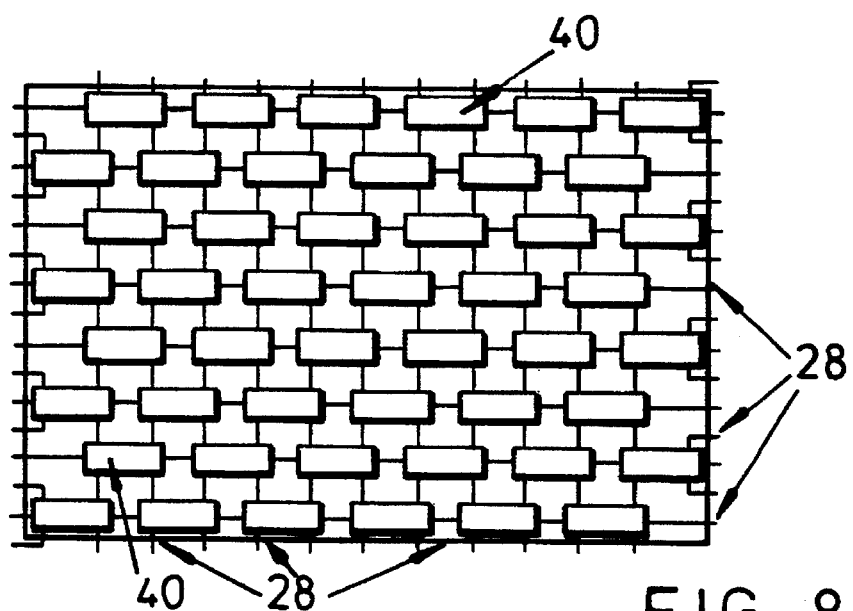
FIG. 8 illustrates the edge interconnection of boards incorporating the FIG. 7 circuits.

By way of a specific example it is well known that two-dimensional gases can be modelled as a lattice of discrete points which are governed by deterministic transition rules as set forth in the article entitled "Lattice-Gas Automata for the Navier-Stokes Equation" by Frisch, Hasslacher & Pomeau published in Physical Review Letters Vol. 56, No. 14. The apparatus 12 can be applied to this spatially-extended modelling process by representing each point in the gas lattice with a sequential logic circuit 40 having six input 42 and six output wires 44 and by connecting adjacent logic circuits 40 via switches so that the inputs of one circuit go to the outputs of another circuit in a hexagonal lattice topology as shown in FIG. 7. Within each circuit 40 switches are set to establish an AND array accounting for the 64 different combinations of incoming particles (molecules) and an OR array to compute when an outgoing particle (molecule) is to be sent in each of 6 directions. The truth table (not shown) of the logic circuit encodes the rules for the lattice gas and D-type latches on the 6 output wires are clocked by a synchronisation signal so that the output pulses at each instant represent a delayed function of the input pulses of the previous clock period. At the edges of the boards the wires from the marginal sequential circuits 40 are sent to adjacent boards along the conductor set 28 (of FIG. 5) so that they connect to the appropriate inputs and outputs of circuits 40 on adjacent boards. This is shown in FIG. 8.

We claim:

1. An apparatus for simulating a spatially-extended physical process a complete spatial extent of which is made up of a number of localities each defined by parameters of the process, the apparatus comprising:

a plurality of multi-state sequential digital logic circuits each configured to represent a respective locality of a process so that possible states of each said circuits represent possible states of pertaining parameters;

means for interconnecting at least those said circuits representing localities having mutual interaction;

means for initially establishing each logic circuit in an known state;

means for pulsing at least one of said circuits to cause circuits of the array to evolve through at least some of their possible states; and means for intermittently determining the states of at least some of said circuits to provide a measure of the corresponding states of the parameters of the physical process;

wherein each of said configured digital logic circuits is implemented by a universal sequential digital logic circuit having means adapted to configure the pertaining universal circuit to have a desired sequential behavior to represent the parameters of a particular locality.

2. An apparatus as defined in claim 1, wherein said plurality of multi-state sequential digital logic circuits comprise a plurality of rectangular circuit boards each having a universal sequential digital logic circuit and adaption means, each of said boards further having orthogonally disposed signal conductors emergent from an edge thereof and interconnected to adjacent boards.

3. An apparatus as defined in claim 2, wherein said signal conductors comprise a first conductor set interconnecting said universal sequential digital logic circuits of adjacent boards, and a second conductor set interconnecting said adaption means of adjacent boards.

4. An apparatus as defined in claim 3, wherein said initially establishing means comprises said fixed logic circuits, an interconnection thereof with the pertaining universal sequential digital logic circuit, signals conducted by the second conductor set, and synchronization signals delivered to the fixed logic circuits from a central synchronization unit.

5. An apparatus as defined in claim 2, wherein each board has adjacent sequential digital logic circuits interconnected via orthogonally disposed signal pathways forming on-board extensions of said orthogonally disposed signal conductors, said signal pathways comprising selectively-operable switches having settings of which define presence or absence of an interconnection between adjacent configured sequential digital logic circuits.

6. An apparatus as defined in claim 1, wherein said adaption means comprises a fixed logic circuit.

7. A method of simulating a spatially-extended physical process a complete spatial extent of which is made up of a number of localities each defined by parameters of the process, comprising:

representing each locality not by a microprocessor but by a configured multi-state sequential digital logic circuit possible states of which represent possible states of pertaining parameters;

representing the interaction of each pair of localities with an interconnection between the pertaining configured multi-state sequential digital logic circuits to thereby form an array of such circuits;

initially establishing each logic circuit in a known state;

pulsing at least one of the multi-state configured sequential digital logic circuits in the array to cause circuits of the array to evolve through at least a plurality of possible states; and intermittently determining the states of at least some of the circuits of the array to provide a measure of the corresponding states of the parameters of the physical process;

wherein each configured digital logic circuit is implemented by a universal sequential digital logic circuit associated with means adapted to configure the pertaining universal circuit to have a desired sequential behavior to represent parameters of a particular locality.

8. A method as defined in claim 7, wherein the pulsing step comprises supplying an external pulse signal to all of the circuits of the array.

9. A method as defined in claim 7, wherein the pulsing step comprises supplying an internal pulse signal to at least one of the circuits of the array and to less than all of the circuits of the array.

* * * * *